United States Patent
Sasaki et al.

[11] Patent Number: 6,127,683
[45] Date of Patent: Oct. 3, 2000

[54] ELECTRON BEAM DRAWING APPARATUS

[75] Inventors: Minoru Sasaki, Hitachinaka; Yuji Tange, Mito; Yutaka Hojyo, Hitachinaka; Kazuyoshi Oonuki, Mito; Hiroyuki Itoh, Hitachinaka, all of Japan

[73] Assignee: Hitachi, Ltd., Tokyo, Japan

[21] Appl. No.: 09/396,413

[22] Filed: Sep. 15, 1999

Related U.S. Application Data

[63] Continuation-in-part of application No. 08/922,334, Sep. 3, 1997, Pat. No. 5,972,772.

[30] Foreign Application Priority Data

Sep. 5, 1996 [JP] Japan .................................. 8-235297

[51] Int. Cl.[7] .................................................. A61N 5/00
[52] U.S. Cl. .................. 250/310; 250/492.2; 250/492.22
[58] Field of Search ................................ 250/310, 492.2, 250/492.22, 492.21

[56] References Cited

U.S. PATENT DOCUMENTS

| | | |
|---|---|---|
| 4,636,968 | 1/1987 | Gotou et al. ........................ 250/491.1 |
| 4,870,286 | 10/1989 | Tobuse ................................. 250/492.2 |
| 4,879,473 | 11/1989 | Zumoto et al. ....................... 250/492.2 |
| 5,047,647 | 9/1991 | Itoh et al. ............................ 250/490.1 |
| 5,168,166 | 12/1992 | Hayakawa et al. .................. 250/492.2 |
| 5,402,224 | 3/1995 | Hirukawa et al. ...................... 356/124 |
| 5,422,491 | 6/1995 | Sakamoto ........................... 250/492.22 |
| 5,952,658 | 11/1999 | Shimase et al. .................... 250/492.21 |
| 5,986,263 | 11/1999 | Hiroi et al. ............................. 250/310 |

*Primary Examiner*—Thi Dang
*Attorney, Agent, or Firm*—Kenyon & Kenyon

[57] ABSTRACT

An electron beam drawing process of high throughput, coping with the changes in static distortion and dynamic distortion of a lower layer exposure apparatus or an optical reduction exposure apparatus. At least two marks formed in each chip formed on a wafer are detected for a predetermined number of chips, and the relation between the shape distortion of each chip in the wafer plane and the wafer coordinates is determined from the positions of the detected marks and the designed positions of the marks by a statistical processing. Patterns are drawn in all chips while correcting the patterns to be drawn on the individual chips, by using the relation between the determined chip shape distortion and the wafer coordinates. As a result, the superposition exposure with the lower layer can be achieved with a high throughput and with a high accuracy without any manual adjustment.

6 Claims, 5 Drawing Sheets

ELECTRON BEAM DRAWING APPARATUS

This application is a continuation in part of No. 08/922,334 filed Sep. 3, 1997 now U.S. Pat. No. 5,972,772.

BACKGROUND OF THE INVENTION

1. Field of the Invention

The present invention relates to an electron beam drawing process and an electron beam drawing apparatus and, more particularly, to an electron beam drawing process and an electron beam drawing apparatus capable of highly accurately superposition-exposing a pattern already drawn.

2. Related Art

In recent years, an electron beam drawing apparatus and an optical reduction exposure apparatus are used together to perform hybrid exposure thereby to manufacture an LSI having a multi-layered structure by drawing relatively fine patterns out of a plurality of patterned to be superposition-exposed by the electron beam drawing apparatus and by exposing the other patterns by the optical reduction exposure apparatus.

Here, the exposed pattern by the optical reduction exposure apparatus contains exposure distortion intrinsic to the lens of the optical reduction exposure apparatus and exposure error resulting from the circumferential change at the optical reduction exposure time. As a result, when a pattern is superposed and drawn as designed by the electron beam drawing apparatus on the pattern which has been exposed by the optical reduction exposure apparatus, there arises a problem that alignment error is caused between the patterns of the upper and lower layers.

In order to improve the alignment accuracy between the exposed pattern by the optical reduction exposure apparatus and the drawn pattern by the electron beam drawing apparatus, there has been disclosed in Japanese Patent Laid-Open No. 58621/1987 a process in which the position of a mark formed on a wafer by the optical reduction exposing apparatus is measured to determine the exposure distortion intrinsic to the optical reduction exposure apparatus so that drawing may be performed at the electron beam drawing time while correcting the exposure distortion. When adopting this process, however, in order to cope with the dynamic characteristic change of the optical reduction exposure apparatus, it is necessary to align all the chips on the wafer and to measure the marks frequently.

In Japanese Patent Laid-Open No. 186331/1982, there is disclosed another process in which marks sufficient to evaluate the exposure distortion are arranged in the peripheral portion of a pattern so that they are detected for correction at the drawing time. When adopting this process, however, the number of marks to be detected for evaluating the distortion is so large that the throughput cannot be improved.

In the optical reduction exposure method, on the other hand, in order to shorten the exposure time period, there is used an alignment method in which a mark at a designated point in a wafer is detected to correct the array information of chips in the entire wafer, as disclosed in Japanese Patent Laid-Open No. 169329/1987. This method has merits: (1) reduction of the influence of the mark detection error by a statistical method; and (2) shortening of the time period for detecting the marks. In this method, however, the correction is made only on the array information, and correction of the magnification change and rotation of the chips is finely adjusted manually in view of the exposure results.

SUMMARY OF THE INVENTION

An object of the present invention is to provide an electron beam drawing process and an electron beam drawing apparatus capable of superposition-exposing a pattern, which has static distortion and dynamic distortion and is formed by a lower layer exposure apparatus, particularly an optical reduction exposure apparatus, highly accurately with a high throughput.

According to the present invention, the positions of marks, formed in advance in each chip on a wafer, are measured for a predetermined number of chips, and the relation between the wafer coordinates of each chip and the shape distortion of the chip is determined from the measured mark positions and the designed mark positions by a statistical processing. The invention is characterized in that the alignment accuracy is enhanced together with the throughput by correcting the pattern to be drawn on each chip by using the relation.

According to the present invention, there is provided an electronic beam drawing process for drawing a desired pattern on a plurality of chips set on a wafer, by scanning the wafer with an electron beam, which process comprises: the step of detecting at least two marks formed in the chips, for a predetermined number of chips; the step of determining the relation between the shape distortion of each chip in a wafer plane and the wafer coordinates from the positions of the detected marks and the designed positions of the marks by a statistical processing; and the step of drawing patterns in all chips while correcting the patterns to be drawn on the individual chips, by using the relation, determined by the former step, between the chip shape distortion and the wafer coordinates.

A plurality of series of relations between the chip shape distortion and the wafer coordinates can be provided.

Erroneous detection of the marks can be found by using the information on the chip distortion shape detected. The chip shape distortion can be determined highly accurately by performing the statistical processing excepting the information on the mark position which has been judged to be erroneous.

For either the distortion changing with time or the dynamic distortion different with chips, the relation between the exposing order of a plurality of chips and the chip shape distortion is determined so that the distortions can be coped with by correcting them by means of the relation determined between the exposure order and the shape distortion.

According to the present invention, there is provided an electron beam drawing apparatus which has a function of calculating the alignment by the electron beam drawing method for determining the chip shape distortion by the statistical processing; and a function of selecting the electron beam drawing method for determining the chip shape distortion by the statistical processing when the calculated alignment accuracy is within a predetermined accuracy, and automatically switching to the other electron beam drawing method when the calculated alignment accuracy is lower than a predetermined accuracy.

DETAILED DESCRIPTION

The present invention will be described in connection with its embodiments with reference to the accompanying drawings.

Figure 1:
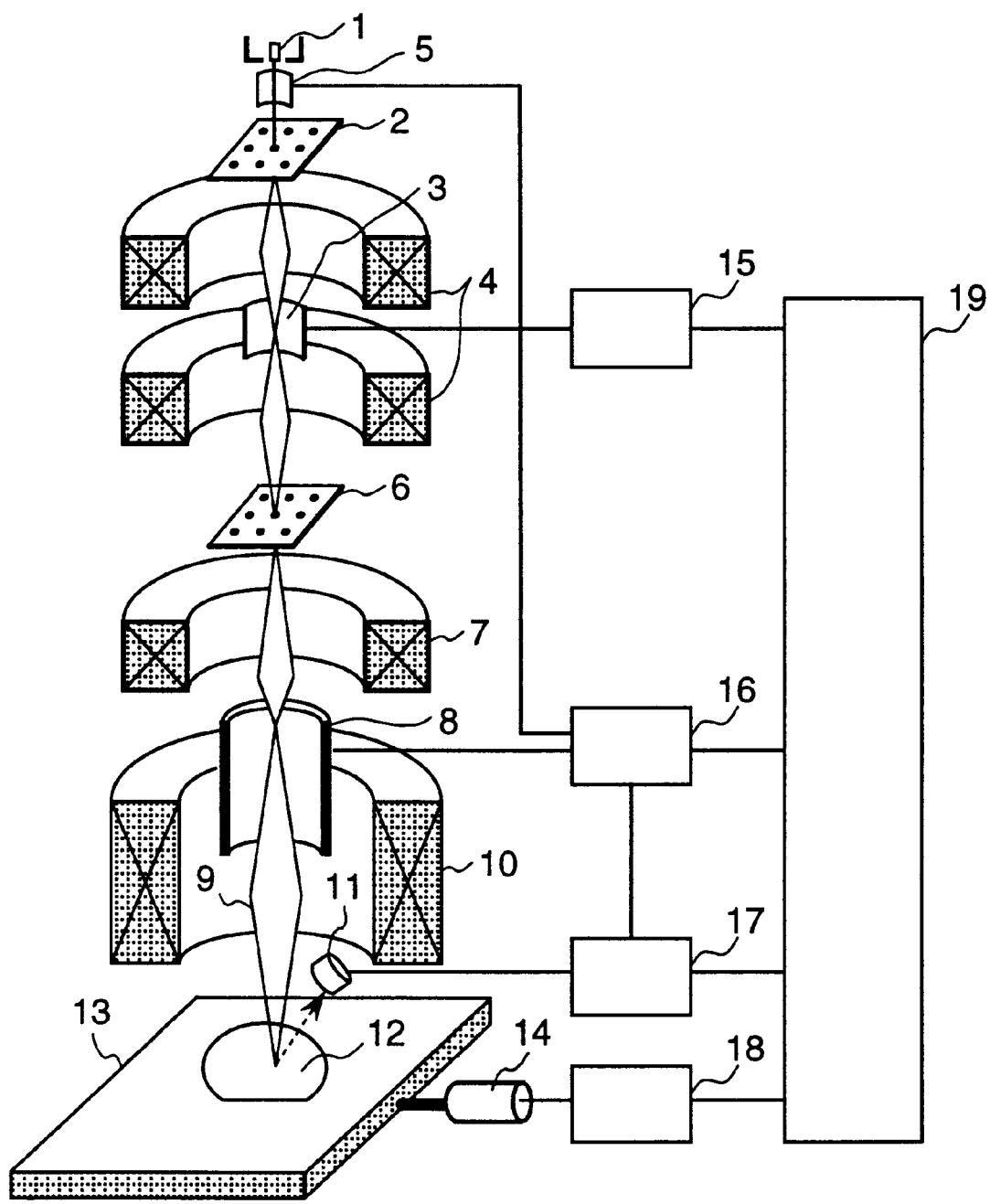
FIG. 1 is a schematic diagram showing an electron beam drawing apparatus used in a process of the present invention.

FIG. 1 is a schematic diagram showing an electron beam drawing apparatus used in a process of the present invention. An electron beam emitted from an electron source 1 passes through a first mask (a rectangle shaping stop) 2 and a shaping lens 4 and arrives at a second mask (a variable shaping stop) 6. Before an electron beam is projected on the second mask 6 and is passed therethrough, the electron beam is shaped into a rectangle having a specified size on a wafer according to the voltage applied to a shaping deflector 3 which is controlled so as to shape the electron beam by a shaping deflection control circuit 15, which is controlled by a control computer for specifying the size of the electron beam.

An electron beam (a shaped beam) 9 having passed through the second mask is reduced by a reducing lens 7, and a deflection position designated by the control computer 19 is set in a positioning deflection control circuit 16, so that the deflection signal is set in a positioning deflector 8. As a result, the shaped beam 9 is deflected toward the designated position, so that it impinges on the wafer 12 on a sample stage 13 through an objective lens 10. The sample stage 13 is moved by a sample stage positioning mechanism 14 and a sample stage position control circuit 18 according to a command coming from the control computer 19.

An LSI pattern of a designated shape can be drawn in the designated position on the wafer 12 by the controls of the shaped beam 9 and the sample stage 13 described above.

The reflection electronic signals of the shape beam 9 having fallen on the mark on the wafer 12 are detected by a reflected electron detector 11 and processed by a mark detecting circuit 17, and the control computer 19 can be informed of the location of the mark formed on the wafer 12.

Here will be described an electron beam drawing method of the present invention using the electron beam drawing apparatus. First, the distortion of a pattern formed by an optical reduction exposure apparatus will be described in the following.

Figure 2:
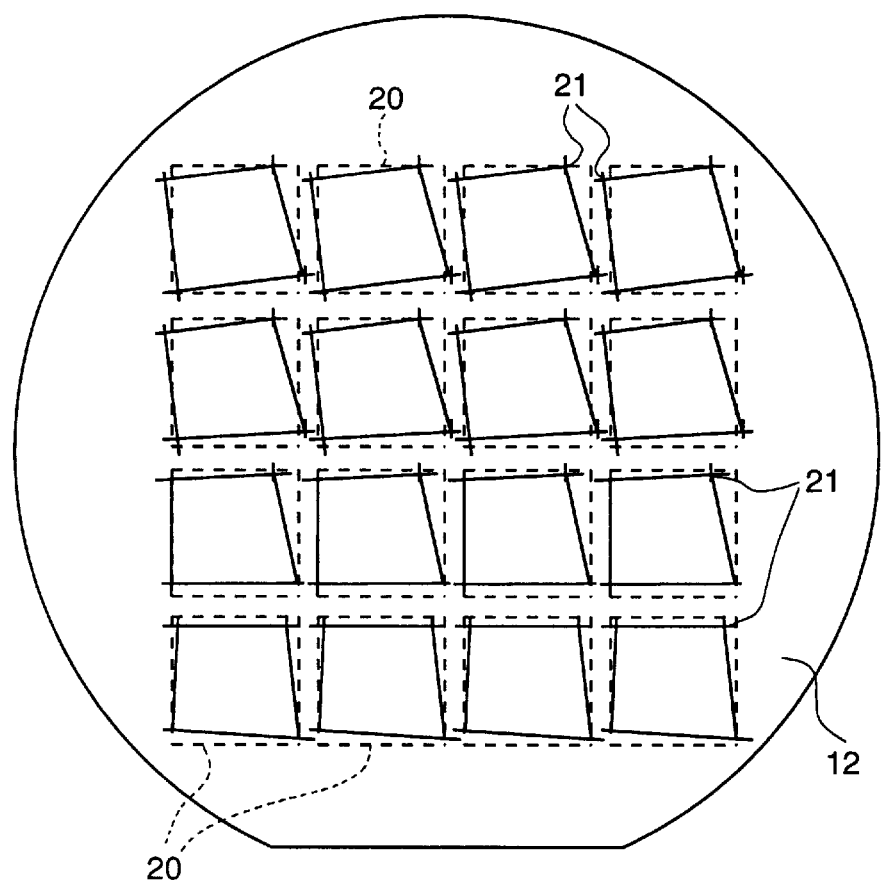
FIG. 2 is a diagram for explaining the results of exposure of a lower layer.

FIG. 2 shows an array of chips formed over the wafer 12. Rectangles 20 shown by broken lines in FIG. 2 show designed chip shapes. On the other hand, rectangles shown by solid lines exaggeratedly show chip shapes which has been exposed by the optical reduction exposure apparatus, for each chip, in this example, cross marks 21 together with a pattern are projected at the four corners of the chip, and the rectangles shown by the solid lines are formed by connecting the marks which are arranged at the four corners of the chip.

When one chip is exposed in a single shot by the optical reduction exposure apparatus, its shape has a variety of distortions 1 to 4, as follows, for the designed shape 20:

1. Intrinsic distortion due to the lens aberration;

2. Magnification change due to the environment (such as the temperature and the atmospheric pressure) change at exposure;

3. Rotation of each chip shape depending on exposure position; and

4. Array error of each chip.

The distortion due to the lens aberration is a static one of high order with respect to the chip center. The magnification change is minute for one wafer exposure and varies for each wafer. The rotation of each chip is caused due to the yawing or the like of the sample stage of the optical reduction exposure apparatus. The array error of each chip is caused by the error of a stage length measuring system such as the change in the laser wavelength of the laser length measuring system due to the change in the atmospheric pressure or by the deformation of a length measuring mirror set in a stage.

The distortion of the chip shape is expressed by the following mathematical formulae.

Now, an X-Y coordinate system is set on the wafer, letting the coordinates of each chip from the wafer center be (Xw, Yw), the coordinates of the exposure position in the chip be (Xc, Yc) and the exposed position in the chip be (X'c, Y'c); the exposed position (X'c, Y'c) corrected in view of the distortion can be expressed by the following Equations 1 and 2:

$$X'c = f_0(Xw,Yw) + a_1 \cdot Xc + f_2(Xw,Yw)Yc + f_3(Xc,Yc) \quad (1);$$

and $$Y'c = g_0(Xw,Yw) + g_1(Xw,Yw)Xc + b_2 \cdot Yc + g_3(Xc,Yc) \quad (2).$$

In the Equations 1 and 2, functions $f_0(Xw, Yw)$ and $g_0(Xw, Yw)$ express a shift, i.e., a parallel movement, and symbols $a_1$ and $b_2$ represent magnification variations. Moreover, functions $f_2(Xw, Yw)$ and $g_1(Xw, Yw)$ represent rotations, and functions $f_3(Xc, Yc)$ and $g_3(Xc, Yc)$ express static distortions.

In the optical reduction exposure apparatus, the lens is changed in temperature by the energy which is accumulated in the lens by the irradiation of it, and it is deformed. Considering this change, and assuming the magnification variations $a_1$ and $b_2$ to be functions of the coordinates (Xw, Yw), the foregoing Equations 1 and 2 can be expressed by the following Equations 3 and 4:

$$X'c = f_0(Xw,Yw) + f_1(Xw,Yw)Xc + f_2(Xw,Yw)Yc + f_3(Xc,Yc) \quad (3);$$

and $$Y'c = g_0(Xw,Yw) + g_1(Xw,Yw)Xc + g_2(Xw,Yw)Yc + g_3(Xc,Yc) \quad (4).$$

By calculating $f_0$, $f_1$, $f_2$, $f_3$, $g_0$, $g_1$, $g_2$ and $g_3$ in the Equations 3 and 4, it is possible to determined the relations among the chips which are exposed by a lower layer exposure apparatus, over the whole surface of the wafer. When a pattern is drawn or this whole wafer surface by using the relations, the exposure can be done with a high alignment accuracy.

Figure 3:
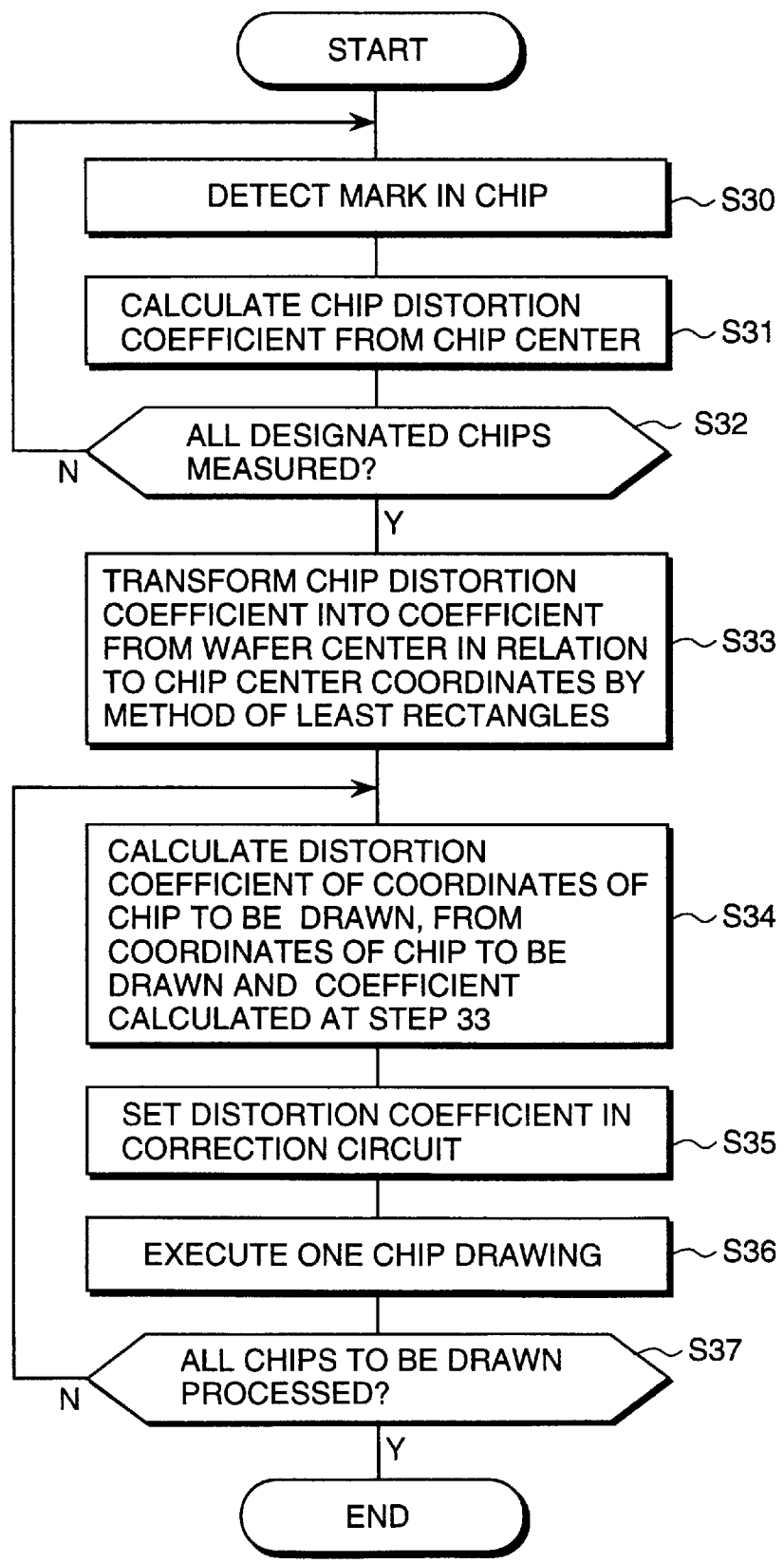
FIG. 3 is a flowchart for explaining a drawing method according to the present invention.

With reference to the flowchart of FIG. 3, here will be described a drawing procedure for correcting the drawing position by determining those relations.

First, the sample stage 13 is moved so that the mark position in a designated chip may come to the position of a deflection zero point of the shaped beam 9. At Step 30, the position of the mark 21 is detected by the mark detecting circuit 17 by scanning the mark 21 with the shaped beam.

This result is taken in the control computer 19. This processing is repeated specified times equal to the number of designated marks in the chip, and the matching coefficient Equations 5 and 6 shown below are calculated at Step 31 by the method of least rectangles. Here, the designed coordinates of the mark position in the chip are denoted by (Xmc, Ymc), and the measured coordinates of the mark position in the chip are denoted by (Xmcm, Ymcm).

$$Xmcm = a_0 + a_1 Xmc + a_2 Ymc + a_3 XmcYmc \tag{5}$$

and $$Ymcm = b_0 + b_1 Xmc + b_2 Ymc + b_3 XmcYmc \tag{6}$$

These equations give the alignment coefficients when four marks exist in the chip, but alignment correction coefficients of the higher order can be calculated for more marks. These marks detections and the calculations of the alignment correction coefficients are repeated (at Step 32) for the designated chips.

Next, it is assumed that the relations between the alignment coefficients $a_0$, $a_1$, $a_2$, $a_3$, $b_0$, $b_1$, $b_2$ and $b_3$ measured for the individual chips, and the coordinates (Xw, Yw) of the chips from the waver center be expressed by the following Equations 7 to 14:

$$a_0 = A_{00} + A_{01} Xw + A_{02} Yw + A_{03} XwYw \tag{7}$$

$$a_1 = A_{10} + A_{11} Xw + A_{12} Yw + A_{13} XwYw \tag{8}$$

$$a_2 = A_{20} + A_{21} Xw + A_{22} Yw + A_{23} XwYw \tag{9}$$

$$a_3 = A_{30} \tag{10}$$

$$b_0 = B_{00} + B_{01} Xw + B_{02} Yw + B_{03} XwYw \tag{11}$$

$$b_1 = B_{10} + B_{11} Xw + B_{12} Yw + B_{13} XwYw \tag{12}$$

$$b_2 = B_{20} + B_{21} Xw + B_{22} Yw + B_{23} XwYw \tag{13}$$

and $$b_3 = B_{30} \tag{14}$$

The relations $f_0$, $f_1$, $f_2$, $f_3$, $g_0$, $g_1$, $g_2$ and $g_3$ can be calculated at Step 33 by calculating the coefficients $A_{00}$, $A_{01}$, $A_{02}$, ..., $B_{22}$, $B_{23}$ and $B_{30}$ of the Equations 7 to 14 by the method of least rectangles.

The order of the coefficients of the Equations 7 to 14 can be corrected in a higher order in accordance with the lower layer exposure apparatus. Especially since the correction equation for the chip array positions expressed by the Equations 7 and 11 depends upon the linearity of the mirror of a laser interferometer which is fixed on the sample stage 13 for measuring the position of the sample stage 13, more accurate approximation can be achieved when the correction equations are changed to approximating ones of third or fifth order.

When the whole wafer surface is drawn, the distortion coefficients are calculated at Step 34 by substituting the coordinates of the target chip on the wafer plane in the relations between the matching coefficients $a_0$, $a_1$, $a_2$, $a_3$, $b_0$, $b_1$, $b_2$ and $b_3$ expressed by the Equations 7 to 14. At Step 35, the distortion coefficient calculated at Step 34 is then applied to the deflection target data in one chip and is corrected for the designated coordinates to obtain the target coordinates. Then, one chip is drawn at Step 36. The chips of the whole wafer surface are thus processed to end the drawing of all chips (at Step 37).

Figure 4:
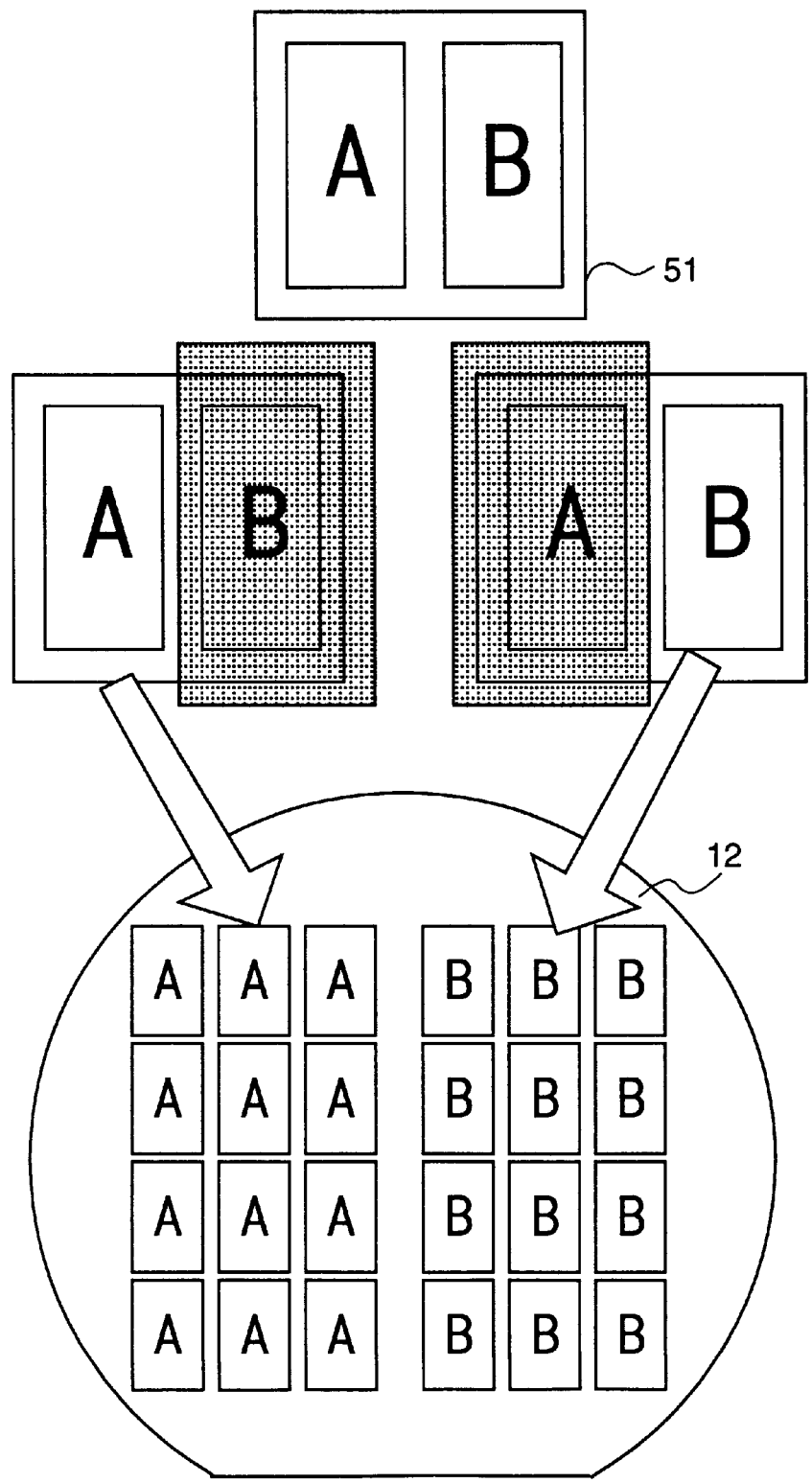
FIG. 4 is a diagram for explaining an exposing method using a reticle having a plurality of formed patterns.

As shown in FIG. 4, a plurality of patterns (two patterns A and B in FIG. 4) are formed on a reticle 51 used in the optical reduction exposure apparatus and one pattern is exposed by masking the other pattern. At this time, two groups of chips of patterns A and B are formed, as shown, over the wafer 12.

If the correction is performed in this case according to the aforementioned procedure, the intrinsic distortions of the patterns A and B are different from each other when the relations of the Equations 7 to 14 are commonly used for the whole wafer surface, thereby causing a problem of misalignment. By preparing a plurality of relations such as the relation of the chips of the pattern A and the relation of the chips of the pattern B, the chips of either pattern can be drawn with a highly accurate alignment.

It is then needless to say that the relations of the matching coefficients $a_0$, $a_1$, $a_2$, $a_3$, $b_0$, $b_1$, $b_2$ and $b_3$ expressed by the Equations 7 to 14, for the chips of the pattern A are calculated by detecting the marks formed on the chips of the pattern A whereas the relations for corrections of the chips of the pattern B are calculated by detecting the marks formed on the chips of the pattern B.

Figure 5:
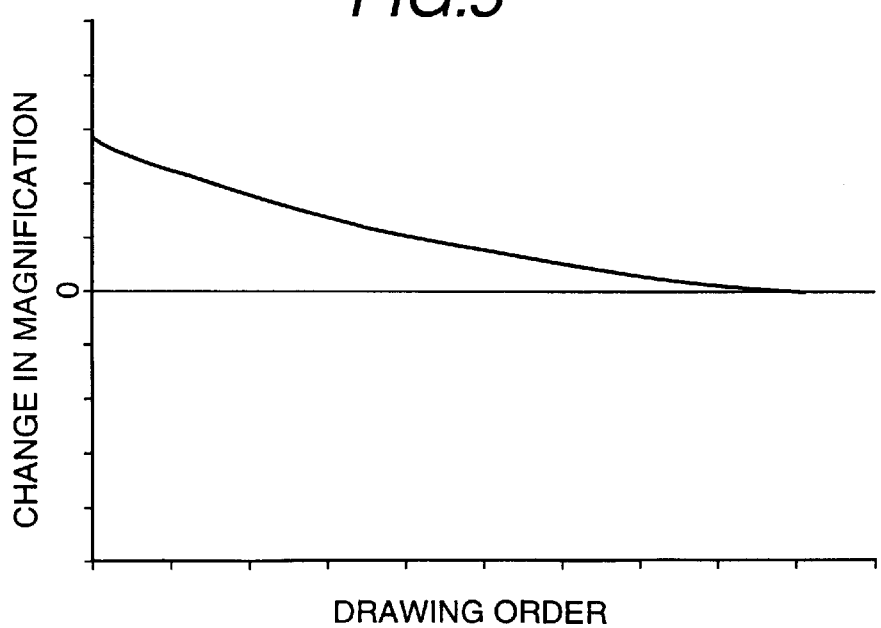
FIG. 5 is a diagram showing the relation between the exposing order by an optical exposing apparatus and the change of magnification of each chip.

In the above, the magnification coefficients $a_1$ and $b_2$ are calculated by the relations of the coordinates (Xw, Yw) of the chips. In the case of the optical reduction exposure apparatus, as shown in FIG. 5, the magnification changes from the unexposed state that the lens is not exposed to the beam, to the stable exposed state that the lens is irradiated with the beam and its temperature rise is saturated to a constant lens temperature. This changing magnification is difficult to express using the relations of positions X and Y.

Therefore, the control calculation equations are stored in advance with the exposure order of the individual chips, and the relations between this exposure order Tn and the magnification change coefficients $a_1$ and $b_2$ are calculated by the following Equations 15 and 16:

$$a_1 = C_0 + C_1 Tn + C_2 Tn2 \tag{15}$$

and $$b_2 = D_0 + D_1 Tn + D_2 Tn2 \tag{16}$$

The magnification change ceases after a predetermined time because the lens temperature is stabilized. When the above approximate equations are applied to all the chips, there occur errors. Hence, the magnification change is sequentially determined for a next chip to be measured from the starting chip of the lower layer exposure, and the above relations are applied to chips having a predetermined or less change whereas the subsequent chips are exposed with the average magnification of the chips.

By executing the exposure of the lower layer by the relations on the exposure order, it is possible to effect the superposition exposure matching with the magnification change depending on the exposure order of the lower layer exposure apparatus. The chips to be subjected to the mark measurement can also be exposed highly accurately while suppressing the reduction in the throughput by designating a dense exposure for the chips after the exposure start at the lower layer exposure but a thin exposure for the chips considered to be in the stable state.

According to the process thus far described, the method of least rectangles is used to calculate the relations $f_0$, $f_1$, $f_2$, $f_3$, $g_0$, $g_1$, $g_2$ and $g_3$ of the individual coefficients so that the minute error attributed to the mark detection themselves can be reduced, compared with the chip alignment method of the prior art in which the mark detection is carried out for each chip and the chip is drawn according to the detection result.

However, a large error which may be caused by mark breakage cannot be avoided to reflect its influence upon the drawing result. For eliminating this mark detection error, there has been contrived a method in which whole the detected mark coordinates are linearly approximated to detect an abnormal mark from the difference. By this method, however, all the mark coordinates including the ones of the abnormal mark are linearly approximated, and even the mark correctly measured in the vicinity of the abnormal mark may possibly be detected as an abnormal one.

According to the process of the present invention, the chip shape of each chip is calculated. By utilizing the change in this chip shape, therefore, error judgment can be accurately made.

As described hereinbefore, the distortion of second or higher order with respect to the X-Y coordinates on the wafer is a static one intrinsic to the apparatus. Therefore, the values $a_3$ and $b_3$ in the Equations 5 and 6 calculated for each measured chip, and the values $A_{30}$ and $B_{30}$ in the Equations 10 and 14 calculated in the wafer plane are employed for evaluation of the detection of mark abnormality.

Figure 6:
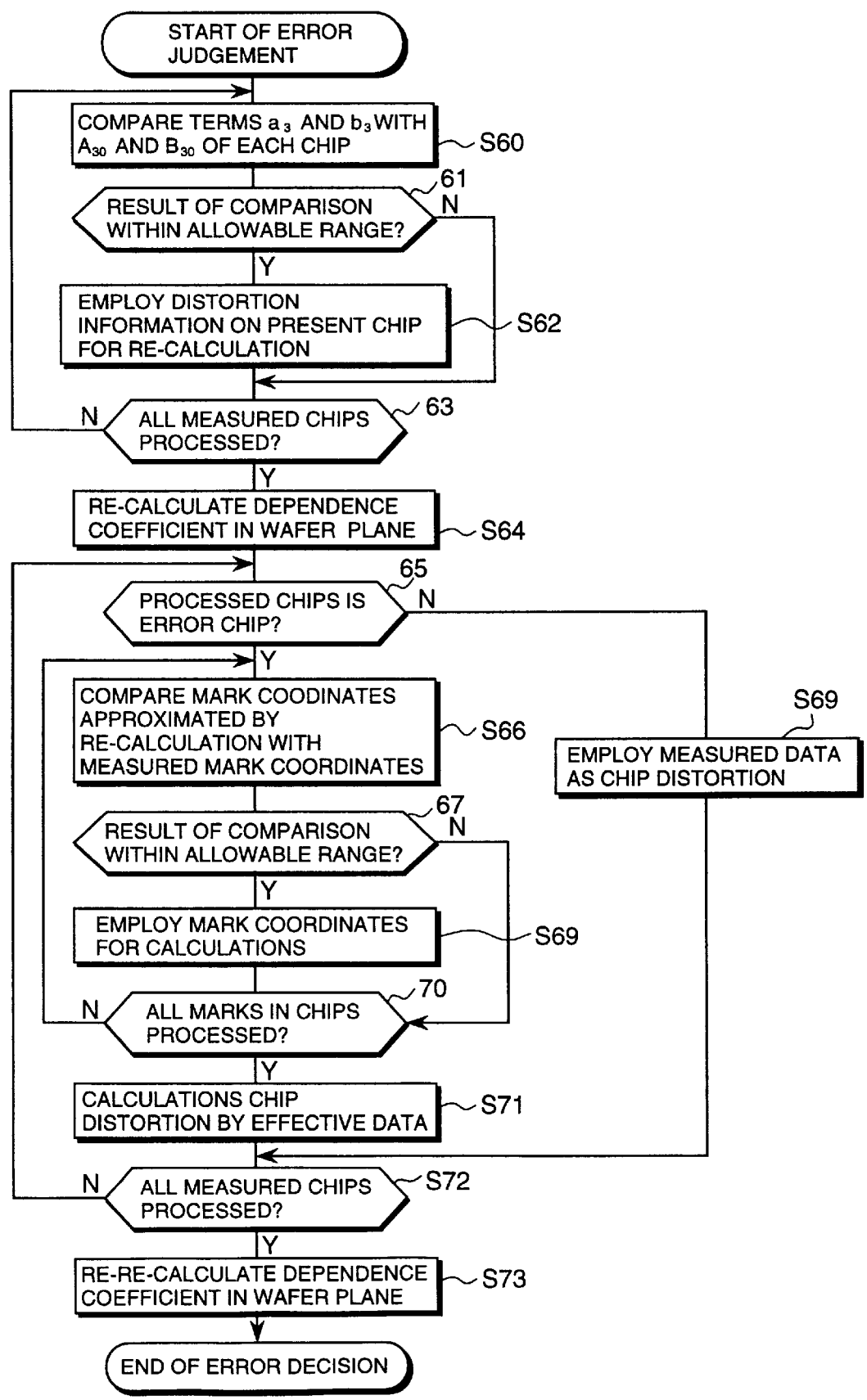
FIG. 6 is a flowchart for explaining a method of calculating a distortion coefficient excluding an abnormal mark.

With reference to a flowchart of FIG. 6, here will be described a method of calculating the distortion coefficients excepting the abnormal mark.

At first Step 60, as to the measured chips, differences are taken between the values $a_3$ and $b_3$ determined for the individual chips and the values $A_{30}$ and $B_{30}$ determined for all the chips, and the individual coordinate data of the marks from the chip center are applied to those differences, as expressed by Equations 17 and 18:

$$dX = |(A_{30}-a_3) X_{mc} Y_{mc}| \tag{17}$$

and $$dY = |(B_{30}-b_3) X_{mc} Y_{mc}| \tag{18}$$

At Step 61, the data calculated by the Equations 17 and 18, and an allowable value p1, designated in advance and set in the control computer 19, are compared, and the positions of the chips having marks whose data are over the value p1, the marks and the distortion coefficient information are stored. The coefficient Equations 7 to 14 of the chips whose data do not exceed the value p1 are calculated again, and the following Equations 19 to 26 (at Step 62 and at Step 64) are obtained.

$$a_0 = A'_{00} + A'_{01} X_w + A'_{02} Y_w + A'_{03} X_w Y_w \tag{19}$$

$$a_1 = A'_{10} + A'_{11} X_w + A'_{12} Y_w + A'_{13} X_w Y_w \tag{20}$$

$$a_2 = A'_{20} + A'_{21} X_w + A'_{22} Y_w + A'_{23} X_w Y_w \tag{21}$$

$$a_3 = A'_{30} \tag{22}$$

$$b_0 = B'_{00} + B'_{01} X_w + B'_{02} Y_w + B'_{03} X_w Y_w \tag{23}$$

$$b_1 = B'_{10} + B'_{11} X_w + B'_{12} Y_w + B'_{13} X_w Y_w \tag{24}$$

$$b_2 = B'_{20} + B'_{21} X_w + B'_{22} Y_w + B'_{23} X_w Y_w \tag{25}$$

and $$b_3 = B'_{30} \tag{26}$$

Thus, the distortions of high order of chips can be calculated more practically by eliminating the abnormal marks. However, the shifts, rotations and magnifications of the chips can be approximated more accurately when more information is available.

By using the relations of the Equations 19 to 26, therefore, the chips (error chips) exceeding the allowable value p1 are subjected to the following processing to detect error marks. When it is judged at Step 65 that the processed chip is an error chip, the procedure advances to Step 66. At this Step 66, the distortion coefficients of the error chips are calculated by using the Equations 19 to 26. Then, the chip coordinates are substituted in the calculation results to calculate estimated coordinates for the individual marks, and absolute values are taken of the differences between the coordinates and the measured mark coordinates and are compared with an allowable value p2 which is stored in advance in the control computer.

The marks, which are judged at Step 67 that the comparison results are within the allowable value p2, are used for calculating the distortion coefficients at Step 69 and at Step 71, whereas the marks whose data exceed the allowable value p2 are judged to be the abnormal ones, and they are not used for calculating the chip distortions although the procedure advances from Step 67 to Step 70. In the example being described here, the number of marks in a chip is four, the coefficients are expressed by four factors, the shift, the rotation, the magnification and the XY term. When the number of marks decreases, therefore, calculatable coefficients are calculated matching with the number of marks.

The distortion coefficients of the chips having error marks thus obtained and the distortion coefficients (of Step 68) of the normal chips are used to calculated the coefficients of the Equations 7 to 14 at Step 73 thereby to generate the coefficients in the wafer plane. By using the coefficients thus obtained, the exposures can be done so highly accurately, hardly being influenced by the abnormal marks.

Although the whole wafer surface can be highly accurately exposed by this method, approximate calculations are performed, and hence the components of random distortion, if any in the drawing results of the lower layer exposure apparatus, are left as errors.

If no breakage is in the marks on the process the mark detecting accuracy is high, the chip alignment such that the marks of each chip are detected and drawing is performed is effective despite of a problem of a lowered throughput. The chip alignment is effective even when a highly accurate exposure result of even one chip in the wafer plane is desired for experimental fabrication. An LSI product having an accuracy desired by user can be manufactured by enabling the control computer 19 in advance to designate the alignment method according to the statistical processing of the present invention thus far described and other alignment methods such as an alignment for each chip, so that the drawing operation may be performed by switching to the designated alignment method.

By using the coefficients which are calculated by the alignment method according to the statistical processing of the present invention, the ideal coordinates of each mark can be reversely calculated. The results thus obtained by the reverse calculation are compared with the mark coordinates detected actually. The dispersion of the comparison result is calculated and is compared with an allowable value p3 stored in advance in the control computer 19. When the dispersion exceeds the allowable value p3, the random distortion component of the optical reduction exposure apparatus is deemed to have a large value, and the mark detection is done for each chip to draw a chip. If a function of switching this alignment method is added, even the lower layer having random distortion can be automatically drawn highly accurately although the throughput lowers.

Here has been described the electron beam drawing apparatus for variable shaping. However, the present invention can also be applied to an electron beam drawing apparatus of spot type. The present invention can also be applied to any exposure apparatus as long as a plurality of marks in a chip can be measured and the drawing position in the chip can arbitrarily be changed.

Here has also been described an example in which the marks are arranged at the four corners of the chip. However, the distortion in the chip (one shot) of the optical reduction exposure apparatus is expressed by combining the distortion equations of higher (third or higher) order because the lens of the optical reduction exposure apparatus is composed of a combination of lenses. In order to make the correction accurately in the chip by the alignment method using the statistical processing of the present invention, therefore, a number of (ten or more) marks have to be arranged in the chip, thus raising a problem of a lowered throughput. Thus, there has been contrived a method in which the distortion in the chip is measured in advance, as disclosed in Japanese Patent Laid-Open No. 58621/1987.

However, distortion in the chip is partly due to the dynamic change of the optical reduction exposure apparatus, so that the distortion due to the dynamic change as it is cannot be coped with. The distortion has to be highly frequently measured so that the dynamic change of the optical reduction exposure apparatus may be coped with. Therefore, the factors of the measurement results excluding the magnification and the rotation are stored as the static distortions of the optical reduction exposure apparatus. These static distortions need not be measured for the individual wafers but may be measured once for each optical reduction exposure apparatus so long as there is no mechanical change in the lens.

When the present invention is applied by eliminating those static distortion components from the mark detection results and when the data of the distortion correction coefficients of the present invention and the stored static distortion components are combined with the data of the chip being drawn, this process can lead to the improvement of the throughput as well as the alignment accuracy in the chip.

What is claimed is:

1. An electron beam drawing apparatus for drawing a desired pattern superimposed on a pattern previously drawn on a plurality of chips set on a wafer, by scanning said wafer with an electron beam, comprising:

a detector for detecting at least two marks formed in said previously drawn pattern in said chip, for a predetermined number of chips;

a calculating unit connecting said detector for determining the relation between the shape distortion of each chip in a wafer plane and the wafer coordinates from the positions of said marks detected by said detector and the designed positions of said marks by a statistical processing; and a drawing unit connecting said calculating unit for drawing patterns in all chips while correcting the patterns to be drawn on said individual chips, by using the relation, determined by said calculating unit, between the chip shape distortion and said wafer coordinates.

2. An electron beam drawing apparatus according to claim 1, wherein a plurality of series of relations are provided between said chip shape distortion and said wafer coordinates determined in said calculating unit.

3. An electron beam drawing apparatus according to claim 1, further comprising an erroneous detection unit for judging an erroneous detection of said marks by using the information on said chip distortion shape determined by said calculating unit.

4. An electron beam drawing apparatus according to claim 1, wherein said drawing unit determines the relation between the order of exposure of said plurality of chips and said chip shape distortion to correct the pattern to be drawn on each chip, by using the relation between said exposure order and said shape distortion.

5. An electron beam drawing apparatus for drawing a desired pattern superimposed on a pattern previously drawn on a plurality of chips set on a wafer, by scanning said wafer with an electron beam, comprising:

a first correcting unit operating in the step of detecting at least two marks formed in said previously drawn pattern in said chip, for a predetermined number of chips, determining the relation between the shape distortion of each chip in a wafer plane and the wafer coordinates from the positions of said detected marks and the designed positions of said marks by a statistical processing, and correcting the patterns to be drawn on said individual chips, by using the relation, determined by the former step, between the chip shape distortion and said wafer coordinates;

a second correcting unit operating in different steps from said first correcting unit; and a drawing unit for selecting one of said first correcting unit and said second correcting unit and drawing patterns in all chips.

6. An electron beam drawing apparatus according to claim 5, further comprising:

a calculating unit for calculating accuracy of overlap between said positions of said detected marks and the designed positions of said marks; and selecting unit for selecting automatically said first correcting unit when said accuracy of overlap is greater than a predetermined value.

\* \* \* \* \*